(12) United States Patent
Kanda et al.

(10) Patent No.: US 6,998,295 B2
(45) Date of Patent: Feb. 14, 2006

(54) METHOD OF MANUFACTURING A DEVICE PACKAGE

(75) Inventors: Makoto Kanda, Tokyo (JP); Yasunari Shiraishi, Nagasaki (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 127 days.

(21) Appl. No.: 10/720,200

(22) Filed: Nov. 25, 2003

(65) Prior Publication Data
US 2004/0115918 A1   Jun. 17, 2004

(30) Foreign Application Priority Data
Nov. 26, 2002   (JP)   .............................. 2002-342257

(51) Int. Cl.
*H01L 21/44*   (2006.01)

(52) U.S. Cl. ...................................... 438/110; 438/617
(58) Field of Classification Search ..................... None
See application file for complete search history.

(56) References Cited

U.S. PATENT DOCUMENTS

| 4,974,767 A | * | 12/1990 | Alfaro et al. | ............... 228/44.7 |
| 6,091,140 A | * | 7/2000 | Toh et al. | ................... 257/691 |
| 6,756,252 B1 | * | 6/2004 | Nakanishi | ................... 438/617 |

FOREIGN PATENT DOCUMENTS

JP   5-90320   4/1993

* cited by examiner

*Primary Examiner*—Chandra Chaudhari
(74) *Attorney, Agent, or Firm*—Leydig, Voit & Mayer, Ltd.

(57) ABSTRACT

A small ball is formed at an end of a second gold wire that is held and guided by a second capillary. The small ball has a diameter approximately equal to that of a first gold wire. The small ball is bonded to an electrode on an optical device. The second gold wire is separated from the small ball. A large ball is formed at the lower end of the first gold wire, which is held and guided by a first capillary. The large ball is bonded to a wiring pattern on a external wiring substrate. The first capillary is moved upward, and then moved toward the small ball in the horizontal direction. The first gold wire is connected to the large ball. The first gold wire is bonded to the small ball by stitch bonding, and then separated from the small ball.

3 Claims, 4 Drawing Sheets

METHOD OF MANUFACTURING A DEVICE PACKAGE

BACKGROUND OF THE INVENTION

1. Field of the Invention

The present invention relates to a device package in which an electrode on a device, such as a semiconductor device or optical device, is connected to extra-device wiring or the like on an external wiring substrate through a metal wire, and to a method of manufacturing the device package.

2. Description of the Related Art

In general, an electrode on a semiconductor device or the like is electrically connected through a gold wire to extra-device wiring, such as a wiring pattern on an external wiring substrate, using a wire bonding apparatus (for example, see Japanese Laid-Open Patent Publication No. H05-90320). In such a conventional wire bonding technique, a ball formed at the tip end of the gold wire is first bonded to the electrode on the semiconductor device by applying a load, heat, or ultrasonic waves. Subsequently, the gold wire is guided by a capillary and moved to a position above the extra device wiring while forming a predetermined bending shape (loop shape) that is arched. Then, the gold wire is landed on the extra device wiring and bonded thereto by the load, heat or ultrasonic waves applied by the capillary. Thereafter, the capillary is upwardly withdrawn to complete the wire bonding.

However, the height of the top portion of the gold wire forming the bending shape that is arched is very high in the conventional wire bonding technique, so that the gold wire hinders the arrangement of other elements above the semiconductor device. Accordingly, the elements cannot be arranged close to the semiconductor device, thereby entailing a problem of lowering the degree of freedom in the layout of the elements.

Particularly, when an optical conductive path (fiber line or the like) transmitting an optical signal is arranged above the photo-detecting element in an optical device package or in an optical system, the shorter the distance between the photo-detecting element and the optical conductive path becomes, the more the performance or characteristic of the optical device package enhances. Therefore, a low height of the top portion of the gold wire connecting the photo-detecting element to the extra device wiring is greatly demanded in the optical device package in order to shorten the distance between the optical conductive path and the photo-detecting element as much as possible.

SUMMARY OF THE INVENTION

The present invention is accomplished to solve the above-mentioned conventional problem, and aims to provide a device package or a manufacturing method thereof that can lower the height of a top portion of a metal wire and enhance a layout performance of other elements above the device.

According to the present invention which has been achieved to solve the above-mentioned problem, a method of manufacturing a device package is provided. In the device package, a device (for example, a semiconductor device, an optical device such as a photo-detecting element) is electrically connected to extra-device wiring (for example, a wiring pattern) through a metal wire (for example, a gold wire). The method is characterized by including the following steps. That is, a small-diameter ball is formed by using a small-diameter metal wire, and further the small-diameter ball is bonded to the device. Then, the small-diameter metal wire is separated from the small-diameter ball. Meanwhile, a large-diameter ball is formed by using a large-diameter metal wire, and further the large-diameter ball is bonded to the extra device wiring. Then, the large-diameter metal wire connecting with the large-diameter ball is bonded to the small-diameter ball by stitch bonding. After that, the large-diameter metal wire is separated from the small-diameter ball.

As described above, the wire bonding is performed by using two types of metal wires, that is, the large-diameter metal wire and the small-diameter metal wire, which have different diameters from each other. Specifically, the small-diameter ball is formed and bonded at the device side by using the small-diameter metal wire. Then, the large-diameter ball is formed and bonded to the side of the external wiring by using the large-diameter metal wire. Finally, the large-diameter metal wire connecting with the large-diameter ball is bonded to the small-diameter ball by the stitch bonding, to thereby complete the wire bonding. Therefore, the height of the top portion of the metal wire can be lowered, whereby various elements can be arranged close to the upper surface of the device.

Since the height of the top portion of the metal wire can be lowered and other elements can be arranged close to the upper surface of the semiconductor device or optical device, layout performance of the elements can be enhanced, thereby facilitating the production of the device package. In the case of an optical device package in particular, an optical conductive path or the like can be arranged close to the upper surface of the optical device, to thereby be capable of greatly enhancing the performance and characteristic of the optical device package.

BRIEF DESCRIPTION OF THE DRAWINGS

Various characteristics and advantages of the present invention will become clear from the following description taken in conjunction with the preferred embodiments with reference to the accompanying drawings throughout which like parts are designated by like reference numerals, in which:

FIGS. 4A and 4B are side views of device packages, in which FIG. 4A shows the optical device package produced by the wire bonding technique shown in FIGS. 2A to 2C and FIG. 4B shows the optical device package produced by the wire bonding technique shown in FIGS. 3A to 3C.

DESCRIPTION OF THE PREFERRED EMBODIMENTS

An embodiment of the present invention will specifically be described hereinafter with reference to the attached drawings.

Figure 1:
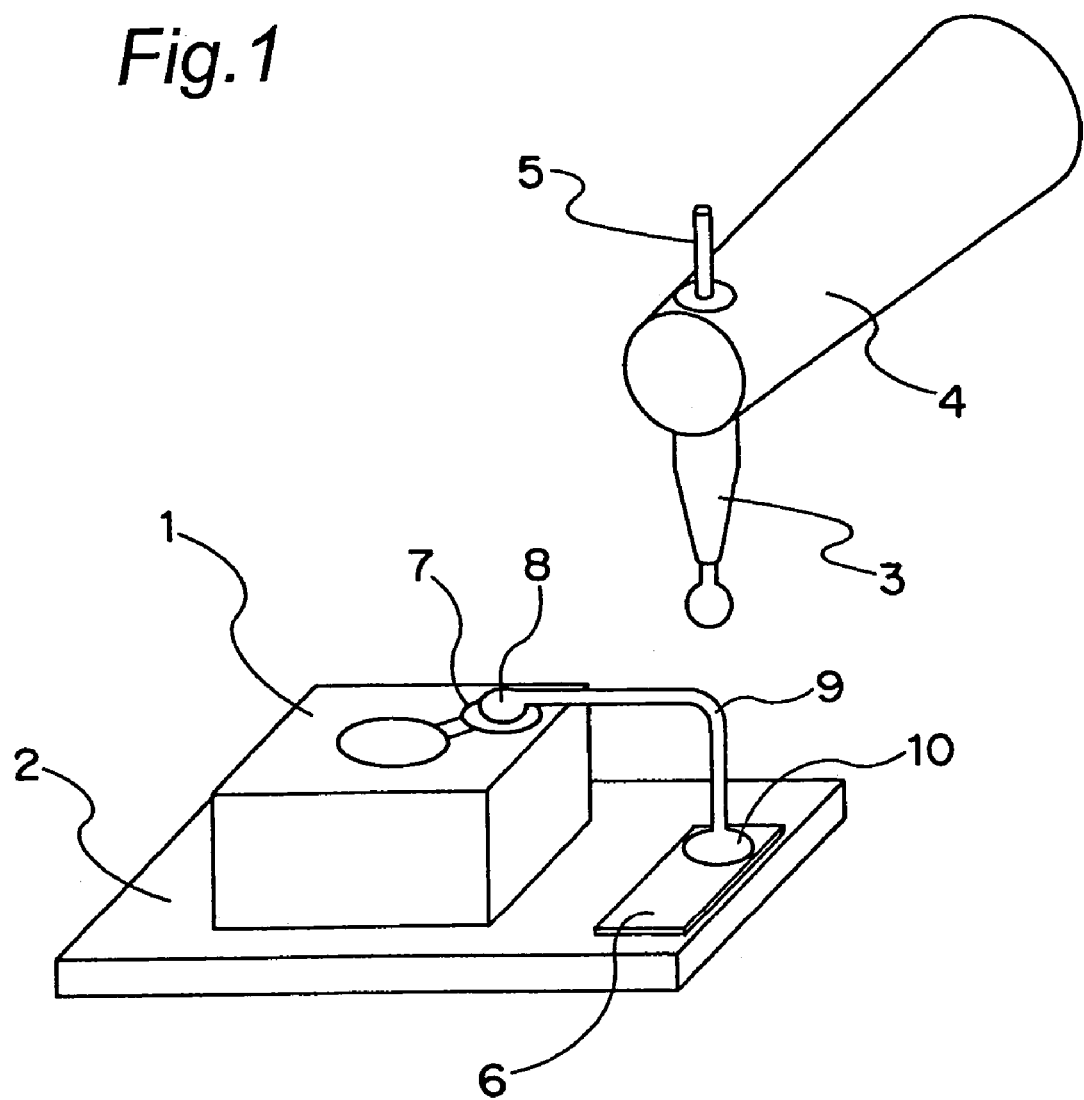
FIG. 1 is a perspective view showing a wire bonding apparatus performing the wire bonding by the wire bonding technique of the present invention, and an optical device package in which an optical device is electrically connected to an external wiring substrate by the wire bonding apparatus.

FIG. 1 shows a wire bonding apparatus using a wire bonding method of the present invention, and an optical device package manufactured by using the wire bonding apparatus. As shown in FIG. 1, the wire bonding apparatus for electrically connecting an optical device 1 (for example, photo-detecting element) to an external wiring substrate 2 with a gold wire has a first capillary 3, a first ultrasonic horn 4 that holds the first capillary 3 and applies ultrasonic vibration thereto (or gold wire), and a first gold wire 5 (a metal wire having a large diameter) having a normal size (diameter).

Figure 2A:
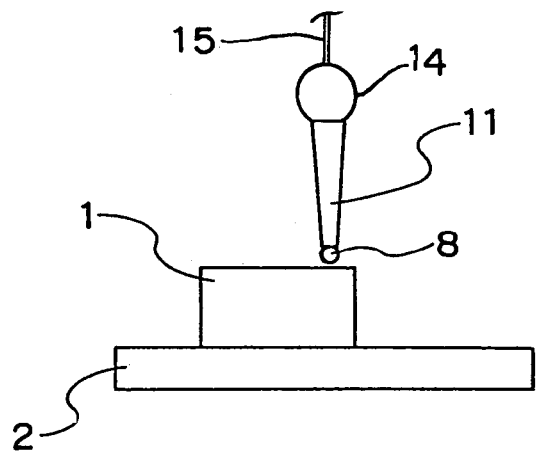
FIGS. 2A to 2C are views showing an operating procedure of the wire bonding using two types of gold wires according to the present invention.

Further, the wire bonding apparatus has a second capillary 11, a second ultrasonic horn 14 that holds the second capillary 11 and applies ultrasonic vibration thereto (or gold wire), and a second gold wire 15 (a metal wire having a small diameter) having a diameter (size) smaller than that of the first gold wire 5 (see FIG. 2A).

The optical device 1 is attached to the upper surface of the external wiring substrate 2 in the optical device package to which a wire bonding is performed by the wire bonding apparatus. An electrode 7 (chip electrode) mounted on the upper surface of the optical device 1 is electrically connected to a wiring pattern 6 (extra device wiring) formed on the upper surface of the external wiring substrate 2 through an approximately spherical small-diameter ball 8 (ball bump), a bonding wire 9 and an approximately spherical large-diameter ball 10 (ball bump).

The diameter (size) of the bonding wire 9 is preferably set so as to adapt to the electrical characteristic of the optical device 1 or optical device package and to cause the bonding wire 9 to stably keep a predetermined bending shape. Since the bonding wire 9 is made of the first gold wire 5 as described later, the diameter of the bonding wire 9 is the same as that of the first gold wire 5. Moreover, the diameter of the second gold wire 15 is preferably set such that the diameter of a small-diameter ball 8 formed on a tip end of the second gold wire 15 becomes approximately the same as the diameter of the bonding wire 9 or the first gold wire 5.

Described hereinafter is a wire bonding method or a manufacturing method of the optical device package for electrically connecting the electrode 7 of the optical device 1 to the wiring pattern 6 on the external wiring substrate 2 by using the wire bonding apparatus.

In the wire bonding process, the approximately spherical small-diameter ball 8 is firstly formed at the lower end portion of the second gold wire 15 held by the second capillary 11 as shown in FIG. 2A. Then, ultrasonic wave is applied to the small-diameter ball 8 by the second ultrasonic horn 14 to thereby bond the small-diameter ball 8 to the electrode 7 of the optical device 1 (see FIG. 1). Since the diameter of the second gold wire 15 is preferably set as described above, the diameter of the small-diameter ball 8 becomes approximately same as that of the first gold wire 5 or the bonding wire 9. Subsequently, the second gold wire 15 is separated from the small-diameter ball 8, and then the second capillary 11 is withdrawn.

Figure 2B:
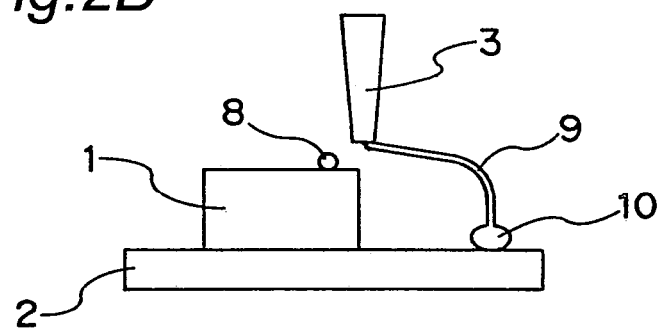

Subsequently, a large-diameter ball 10 is formed at the lower end portion of the first gold wire 5 held by the first capillary 3 as shown in FIG. 2B. Then, ultrasonic wave is applied to the large-diameter ball 10 by the first ultrasonic horn 4 to thereby bond the large-diameter ball 10 to the wiring pattern 6 on the external wiring substrate 2 (see FIG. 1). Further, the first capillary 3 is moved upwardly such that the lower end portion of the capillary is positioned at the place in the vertical direction of the small-diameter ball 8 (at the height of the upper surface of the optical device 1) or at the place a little higher than the above-mentioned place. After that, the first capillary 3 is moved in the horizontal direction with respect to the small-diameter ball 8. By the movement, the first gold wire 5 is guided by the first capillary 3. Thus, the first gold wire 5 connecting with (continuing from) the large-diameter ball 10 bonded on the wiring pattern 6 forms the bonding wire 9 having a predetermined bending shape.

Figure 2C:
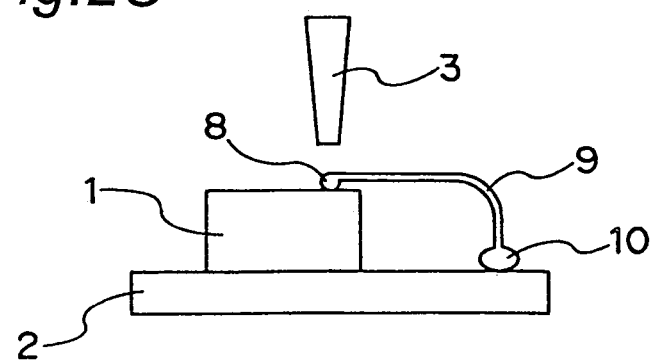

After the first gold wire 5 (bonding wire 9) has been bonded to the small-diameter ball 8 by stitch bonding as shown in FIG. 2C, the first gold wire 5 is separated from the small-diameter ball 8, and then the first capillary 3 is withdrawn. By the movement, the electrode 7 of the optical device 1 is electrically connected to the wiring pattern 6 on the external wiring substrate 2 through the small-diameter ball 8, the bonding wire 9 and the large-diameter ball 10.

The bonding wire 9 has a bending shape (loop shape) rising upwardly from the large-diameter ball 10, bending toward the optical device to change its extending direction at an angle of approximately 90 degrees, and then extending horizontally toward the small-diameter ball 8. Accordingly, the position of a top portion (the highest portion) of the bonding wire 9 in the vertical direction is approximately equal to (slightly higher than) the position of the small-diameter ball 8 in its vertical direction.

Figure 3A:
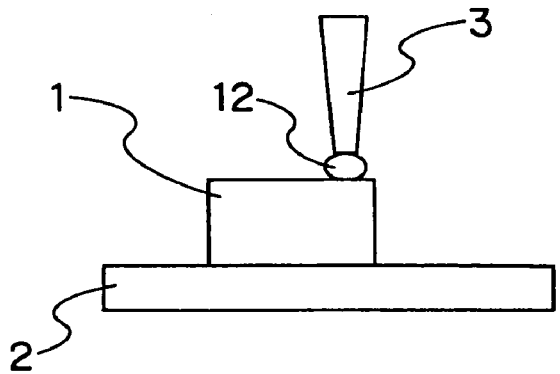
FIGS. 3A to 3C are views showing an operating procedure of the wire bonding using one type of gold wire.
Figure 3B:
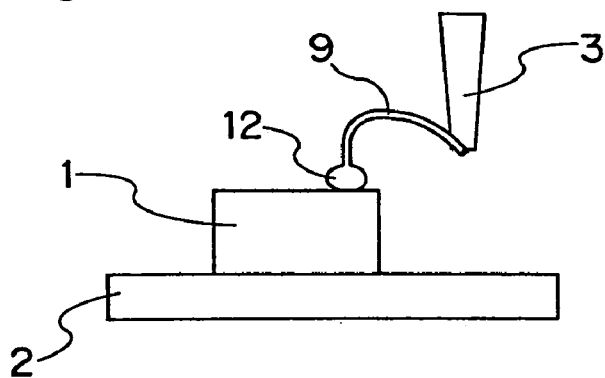
Figure 3C:
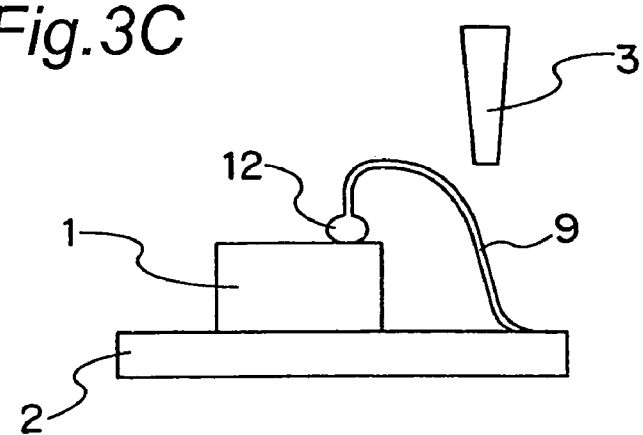

As shown in FIGS. 3A to 3C, in case where only the first capillary 3 and the first ultrasonic horn 4 (see FIG. 1) are used to form a large-diameter ball 12 at a lower end portion of the first gold wire 5 and the large-diameter ball is bonded to the electrode 7 (see FIG. 1) of the optical device, and then the first gold wire 5 or the bonding wire 9 connecting with the large-diameter ball 12 is bonded by stitch bonding to the wiring pattern 6 (see FIG. 1) on the external wiring substrate 2, the top portion of the bonding wire 9 having a bending shape is positioned far higher than the upper surface of the optical device 1 or the large-diameter ball 12.

Figure 4A:
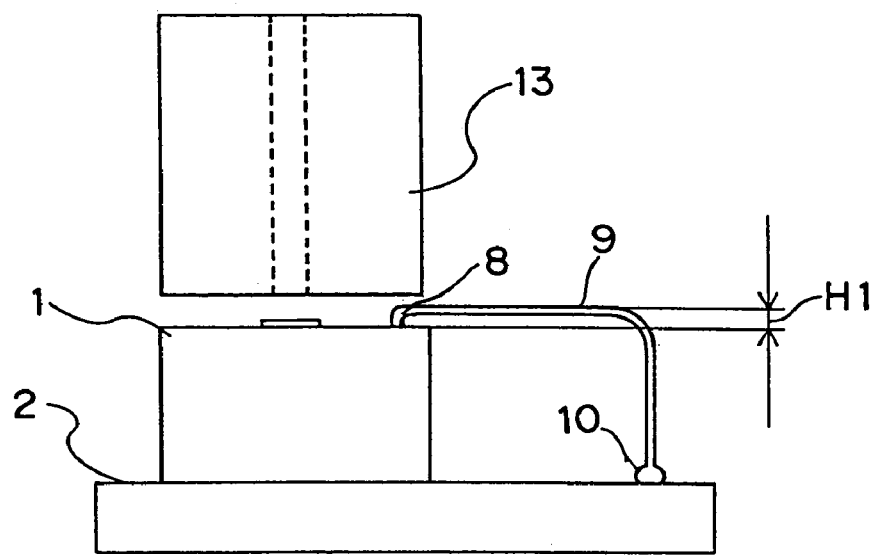

In the optical device package (photo-detecting element package) assembled (manufactured) by using the wire bonding technique of the present invention, the position (height) of the top portion of the bonding wire 9 in the vertical direction is approximately equal to the position (height) of the upper surface of the optical device 1 or the small-diameter ball 8 in the vertical direction as shown in FIG. 4A. Therefore, the distance H1 between the upper surface of the optical device 1 and the top portion of the bonding wire 9 in the vertical direction becomes extremely small. As the result, an optical conductive path 13 (such as optical fiber) arranged above or at the peripheral of the optical device 1 or incorporated into the optical device package can be arranged close to the upper surface of the optical device 1, thereby fully enhancing a performance or characteristic of the optical device package.

Figure 4B:
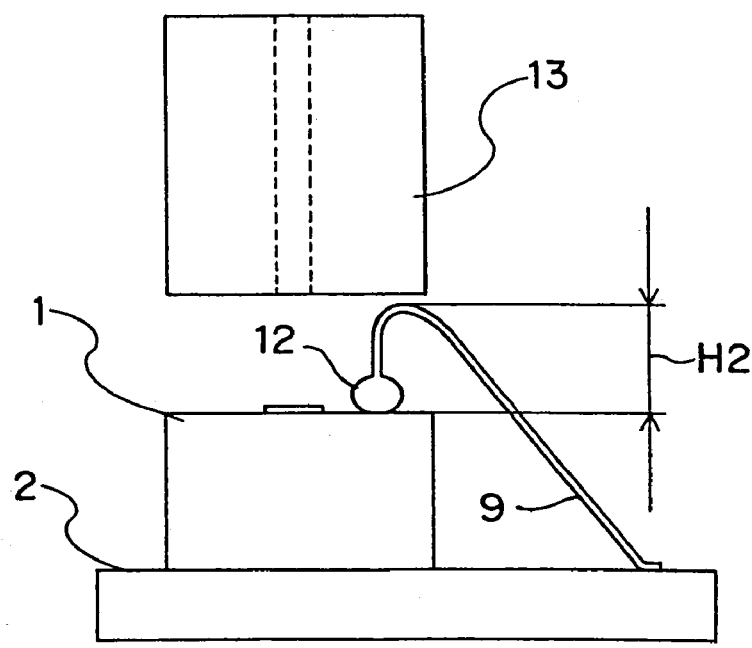

In case where the wire bonding is performed to the optical device 1 and the external wiring substrate 2 with the wire bonding method shown in FIGS. 3A to 3C, the top portion of the bonding wire 9 is positioned far higher than the upper surface of the optical device 1 or the large-diameter ball 12 as shown in FIG. 4B, producing a greater distance H2 between the upper surface of the optical device 1 and the top portion of the bonding wire 9 in the vertical direction. Therefore, the optical conductive path 13 cannot be arranged close to the upper surface of the optical device 1, thereby deteriorating the performance or characteristic of the optical device package.

As described above, according to the wire bonding technique of the present embodiment, only the small-diameter ball 8 is formed and bonded to the optical device 1 by using the second gold wire 15 having a small diameter, then, the large-diameter ball 10 is formed and bonded to the external wiring substrate 2 by using the first gold wire 5 having a large diameter, and finally, the first gold wire 5 connecting with the large-diameter ball 10 is guided to be bonded to the small-diameter ball 8 by the stitch bonding. Accordingly, the following various operations and effects are provided in addition to the above-mentioned operations and effects.

(1) The bonding wire 9 for electrically connecting the optical device 1 to the external wiring substrate 2 generally has a limitation that its diameter has to be made greater to some degree so as to be adapted to the electrical characteristic of the optical device 1 or the optical device package, or so as to stabilize the bending shape of the bonding wire 9. However, such limitation is not imposed on the second gold wire 15 for forming the small-diameter ball 8 on the optical device 1 but any gold wire having an optional diameter (a thinner one) can be used in the wire bonding technique of the present embodiment, since the second gold wire 15 is different from the first gold wire 5 for forming the bonding wire 9.

Accordingly, the small-diameter ball 8 having an optional diameter can be formed on the optical device 1 by preferably setting the thickness of the second gold wire 15. In the present embodiment, the diameter of the small-diameter ball 8 is made approximately same as that of the bonding wire 9 (the first gold wire 5) as described above. The structure assures the bonding between the small-diameter ball 8 and the bonding wire 9 with the diameter of the small-diameter ball 8 set to a required minimum size. Therefore, the height of the top portion of the bonding wire 9 can effectively be reduced. Further, a stable electrical wiring can be realized.

(2) The large-diameter ball 10 at the side of the external wiring substrate 2 and the first gold wire 5 for forming the bonding wire 9 are unrelated to the shape of the small-diameter ball 8 at the side of the optical device 1 in the present embodiment, so that the diameter of the first gold wire 5 can fully and sufficiently be made great. Therefore, the bonding wire 9 can be adapted to the electrical characteristic of the optical device 1 or the optical device package, and further, the bending shape of the bonding wire 9 can be stabilized. Moreover, the bonding strength between the large-diameter ball 10 and the external wiring substrate 2 can be enhanced (stabilized).

(3) In general, a capillary comes in direct contact with an object to be bonded at the bonding section in the stitch bonding, thereby entailing a problem of causing a great damage to the object to be bonded. However, the relatively large first capillary 3 performs the stitch bonding to the small-diameter ball 8 formed on the optical device 1 in the wire bonding technique of the present embodiment, not contacting to the optical device 1 that is the object to be bonded. Therefore, it does not give damage to the optical device 1.

(4) In the wire bonding technique of the present embodiment, the second gold wire 15 for forming the small-diameter ball 8 on the optical device 1 is thinner (smaller) than the first gold wire 5 having a normal size (diameter) for forming the bonding wire 9, whereby a narrow space is enough on the optical device 1 for forming the small-diameter ball 8. Accordingly, the size of the electrode 7 on the optical device 1 can be reduced, thereby being capable of reducing the size of the optical device 1.

(5) Further, both of the electrode 7 on the optical device 1 and the wiring pattern 6 on the external wiring substrate 2 are bonded to the bonding wire 9 by ball bonding in the wire bonding technique of the present embodiment. Therefore, the bonding strength between these and the bonding wire 9 is increased, thereby obtaining a stabilized quality of the optical device package.

The present embodiment describes the wire bonding technique according to the present invention as to the case where the optical device 1 is electrically connected to the external wiring substrate 2. However, the wire bonding method of the present invention can be used for the case where the other devices requiring an electrical connection, such as a semiconductor device other than the optical device, is electrically connected to the external wiring substrate.

In that case, the top portion of the bonding wire 9 can be lowered. Therefore, various elements can be arranged close to the upper surface of the device, thereby basically obtaining the same operations and effects as the above-mentioned optical device 1. In case where the above-mentioned wire bonding is performed to a semiconductor device other than the optical device, and then the semiconductor device is molded with resin to form a mold package, the thickness of the resin mold on the upper surface of the semiconductor device can be thinned, thereby a small-sized and thin-sized mold package can be obtained.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of manufacturing a device package in which a device is electrically connected to external wiring through a metal wire, the method comprising:
    forming a small-diameter ball using a small-diameter metal wire, bonding said small-diameter ball to the device, and then separating said small-diameter metal wire from said small-diameter ball;
    forming a large-diameter ball using a large-diameter metal wire, and bonding said large-diameter ball to the external wiring, said small-diameter ball and metal wire having respective diameters smaller than respective diameters of said large-diameter ball and metal wire; and
    bonding said large-diameter metal wire connected to said large-diameter ball to said small-diameter ball by stitch bonding, and then separating said large-diameter metal wire from said small-diameter ball.

2. The method according to claim 1, wherein the diameter of said large-diameter metal wire is approximately equal to the diameter of said small-diameter ball.

3. The method according to claim 2, wherein said large-diameter metal wire is bonded to said small-diameter ball so that a top portion of said large-diameter metal wire is approximately co-planar with a top portion of said small-diameter ball.

* * * * *